(12) United States Patent
Hamelin et al.

(10) Patent No.: US 11,277,155 B2
(45) Date of Patent: Mar. 15, 2022

(54) DECODER AND DECODING METHOD

(71) Applicant: HUAWEI TECHNOLOGIES CO., LTD., Guangdong (CN)

(72) Inventors: Louis-Philippe Hamelin, Montreal (CA); Chang Hoon Lee, Montreal (CA); Olivier D'Arcy, Longueuil (CA); Guy-Armand Kamendje Tchokobou, Verdun (CA); Paul Alepin, Montreal (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/921,282

(22) Filed: Jul. 6, 2020

(65) Prior Publication Data

US 2022/0006476 A1    Jan. 6, 2022

(51) Int. Cl.
*H03M 13/37* (2006.01)
*H03M 13/45* (2006.01)
(Continued)

(52) U.S. Cl.
CPC ....... *H03M 13/3761* (2013.01); *H03M 13/13* (2013.01); *H03M 13/3977* (2013.01); *H03M 13/45* (2013.01)

(58) Field of Classification Search
CPC ............. H03M 13/3761; H03M 13/45; H03M 13/3977; H03M 13/13
See application file for complete search history.

(56) References Cited

U.S. PATENT DOCUMENTS

2018/0331697 A1    11/2018  Lin et al.
2018/0351698 A1*   12/2018  Lin .................. H04L 1/0045
(Continued)

FOREIGN PATENT DOCUMENTS

| CN | 101001159 A | 7/2007 |
| CN | 109716691 A | 5/2019 |
| CN | 110890896 A | 3/2020 |

OTHER PUBLICATIONS

Giard et al., "Multi-Mode Unrolled Architectures for Polar Decoders", IEEE Transactions on Circuits and Systems I: Regular Papers, 2016, vol. 63, Issue: 9, pp. 1443-1453.
(Continued)

*Primary Examiner* — Thien Nguyen
(74) *Attorney, Agent, or Firm* — BCF LLP

(57) ABSTRACT

The disclosed structures and methods are directed to decoders and to methods for decoding codes, for example, polar codes. The decoder comprises: a codeword node decoding pipeline having three logic units, and configured to, for each encoded codeword node: based on a received instruction sequence, adjust the three logic units for decoding of each encoded codeword node, and decode a set of logarithmic likelihood ratios (LLRs) corresponding to the encoded codeword node to generate decoded bits. The decoder also has an output storage configured to store the decoded bits corresponding to each encoded codeword node, and generate a decoded codeword based on the decoded bits. The decoding method comprises adjusting the codeword node decoding pipeline to each encoded codeword node based on codeword node length and a codeword node type, as well as a bit index of the encoded codeword node.

17 Claims, 8 Drawing Sheets

(51) Int. Cl.
*H03M 13/39* (2006.01)
*H03M 13/13* (2006.01)

(56) References Cited

U.S. PATENT DOCUMENTS

2019/0165807 A1* 5/2019 Wang ............... H03M 13/2927
2020/0067639 A1 2/2020 Lin et al.

OTHER PUBLICATIONS

International Search Report and Written Opinion of PCT/CN2021/104391; Cheng, Jiali; dated Oct. 9, 2021.

* cited by examiner

DECODER AND DECODING METHOD

CROSS-REFERENCE TO RELATED APPLICATIONS

This application is related to US application entitled "Decoder and Decoding Method" and filed on the same day as the instant application. The application is incorporated herein in its entirety.

FIELD OF THE INVENTION

The present invention generally relates to communication networks and, in particular, to decoders and decoding methods, for example, for a polar code.

BACKGROUND

Polar codes have been adopted by the 5G standard as channel coding for an enhanced mobile broadband (eMBB) control channel.

In order to encode information using polar codes, a polar encoder employs a conventional polar code construction procedure to generate a polar codeword that has a polar codeword length of N bits, where N is an integer. As many as K information bits are placed into the most reliable bit positions of the polar codeword and the remaining (N−K) bits of the polar codeword have zero value. The number of such zero-value bits, also referred to as "frozen" bits, is (N−K). A code rate R of such a polar codeword is defined as R=K/N. The positions of the frozen bits relative to the information bits within the polar codeword of N bits define a polar code construction method. These various characteristics of one polar codeword may be represented by a "codeword type", which is a characteristic of the polar codeword that depends on the polar codeword length, the number K of the information bits, and the polar code construction method.

After the polar codeword has been generated, the polar codeword is encoded using an N×N polar code matrix, where N is the number of bits of the polar codeword. An encoded polar codeword generated in such a manner is then transmitted through a communications network.

When the encoded polar codeword is received by a polar decoder, the polar decoder recovers the polar codeword by applying the N×N polar code matrix, equivalent to the matrix that was used by the polar encoder. The polar decoder also needs to have indications of the code rate R and the polar code construction method that was used to encode the polar codeword.

To use the polar code in modern communications networks, polar decoders need to rapidly decode the information and to be adaptable to various applications. The polar decoders also need to quickly adapt to different codeword types.

A known in the art unrolled deeply-pipelined polar decoder (UDPPD) can process codewords of a single codeword type. The UDPPD cannot be modified to process a different codeword type following its silicon implementation. In order to decode codewords of various codeword types, separate units of conventional polar decoders, that are different from each other, need to be implemented in silicon. Although the UDPPDs can achieve high throughput, they cannot be used in real-life communication systems due to their hardware complexity and lack of flexibility. Other currently existing polar decoder architectures also fail to overcome these inconveniences.

SUMMARY

An object of the present disclosure is to provide a decoder and a decoding method for example for polar codes that overcome the inconveniences of currently existing polar decoders. The object of the present disclosure includes providing the polar decoder that may be adapted to various codeword types. The polar decoder as described herein may decode faster and consume less energy than the conventional unrolled polar decoders, such as UDPPDs.

In accordance with this objective, an aspect of the present disclosure provides a decoder (e.g., polar code decoder) comprising: a codeword node decoding pipeline comprising three logic units, and, the codeword node decoding pipeline configured to, for each encoded codeword node: receive a set of logarithmic likelihood ratios (LLRs) corresponding to an encoded codeword node, receive commands that are based on values of a codeword node length and a codeword node type of the encoded codeword node, based on the commands, adjust the three logic units for decoding of the encoded codeword node, decode the set of LLRs to generate decoded bits corresponding to the encoded codeword node; and an output storage configured to: store the decoded bits corresponding to each encoded codeword node of the decoded codeword, and generate the decoded codeword based on the decoded bits.

In at least one embodiments, the three logic units of the codeword node decoding pipeline comprise: an F-G processing unit configured to apply selectively one of F and G arithmetic operations to the set of LLRs to generate intermediate LLR results, the selection of the F and G arithmetic operations being based on a bit index of the encoded codeword node; a specialized decoding unit connected to the F-G processing unit and configured to: receive the intermediate LLR results from the F-G processing unit, and execute a decoding logic on the intermediate LLR results based on the codeword node type, and to generate the decoded bits of the encoded codeword node; and a partial sum (PSUM) unit connected to the specialized decoding unit and configured to: receive, from the specialized decoding unit, the decoded bits of the encoded codeword node, and generate a PSUM value.

The PSUM unit may be further configured to transmit the PSUM value of the decoded codeword node to the F-G processing unit.

The codeword node decoding pipeline may be one of a set of codeword node decoding pipelines having other codeword node decoding pipelines, and the decoder further comprises an upper-stage F-G processing unit configured to: receive other sets of LLRs; receive, from the PSUM unit, a set of PSUM values for performing the G arithmetic operations; perform upper-stage F-G tree operations on the other sets of LLRs; generate intermediate LLR results; and transmit the intermediate LLR results to the other codeword node decoding pipelines.

The commands received by the codeword node decoding pipeline may be further based on a bit index of each encoded codeword node. The decoder may further comprise a program storage configured to receive and store an instruction sequence used to generate commands.

The decoder may further comprise a scheduler configured to receive an instruction sequence and to control adjustment of the codeword node decoding pipeline by sending commands to the codeword node decoding pipeline based on the codeword node length and the codeword node type of each encoded codeword node. The scheduler may be further configured to control the adjustment of the codeword node decoding pipeline based on a bit index of the codeword node. The scheduler may further comprise a counter configured to determine the bit index of a currently processed encoded codeword node of the encoded codeword.

The decoder may further comprise an input storage configured to: receive and store a plurality of sets of LLRs corresponding to the received encoded codeword, and transmit, to the codeword node decoding pipeline, the set of LLRs of the plurality of sets of LLRs. The input storage may be configured to transmit the set of LLRs corresponding to each encoded codeword node at each clock cycle.

In at least one embodiment, the decoder may be one of a plurality of decoders forming a polar decoder array of a vertical array decoder, the set of LLRs being one of a plurality of sets of LLRs, the plurality of sets of LLRs corresponding to one codeword of a plurality of codewords, and the vertical array decoder further comprises: a demultiplexer configured to: receive pluralities of sets of LLRs corresponding to the plurality of codewords, and transmit one plurality of sets of LLRs of the pluralities of sets of LLRs to each decoder of the plurality of decoders; and a multiplexer configured to receive one decoded codeword from each decoder of the plurality of decoders and to generate sequentially a plurality of decoded codewords.

In accordance with another aspect of the present disclosure, there is provided a method for polar code decoding, the method comprising: receiving a plurality of sets of logarithmic likelihood ratios (LLRs) corresponding to an encoded codeword, the encoded codeword having at least one encoded codeword node; for each encoded codeword node of the encoded codeword: receiving a set of LLRs corresponding to the encoded codeword node; adjusting a codeword node decoding pipeline to the encoded codeword node based on commands, the commands being based on values of a codeword node length and a codeword node type of the encoded codeword node; and decoding the set of LLRs, corresponding to the encoded codeword node, by the codeword node decoding pipeline to generate decoded bits corresponding to the encoded codeword node; and generating a decoded codeword based on the decoded bits received from the codeword node decoding pipeline for each encoded codeword node of the encoded codeword.

In at least one embodiment, adjusting the codeword node decoding pipeline to the encoded codeword node further comprises: setting a number of F-G processing elements and F-G processing stages to be used when applying one of F and G operation to the set of LLRs. Adjusting the codeword node decoding pipeline to the encoded codeword node may comprise: setting a decoding logic to be executed at a specialized decoding unit of the codeword node decoding pipeline.

In at least one embodiment, decoding of the set of LLRs further comprises: determining intermediate LLR results at an F-G processing unit of the codeword node decoding pipeline by applying selectively one of F and G arithmetic operations to the set of LLRs. Decoding of the set of LLRs may comprise: determining decoded bits of the encoded codeword node by applying combinatorial logic to the intermediate LLR results. Decoding of the set of LLRs may comprise: determining partial sum (PSUM) values of the decoded bits and transmitting the PSUM values to the F-G processing unit.

The method may further comprise storing the PSUM values and the decoded bits for each encoded codeword node prior to generating the decoded codeword. In at least one embodiment, the commands are related to bit index of each encoded codeword node.

Implementations of the present disclosure each have at least one of the above-mentioned object and/or aspects, but do not necessarily have all of them. It should be understood that some aspects of the present disclosure that have resulted from attempting to attain the above-mentioned object may not satisfy this object and/or may satisfy other objects not specifically recited herein.

Additional and/or alternative features, aspects and advantages of implementations of the present disclosure will become apparent from the following description, the accompanying drawings and the appended claims.

BRIEF DESCRIPTION OF THE FIGURES

Further features and advantages of the present disclosure will become apparent from the following detailed description, taken in combination with the appended drawings, in which.

Figure 1:
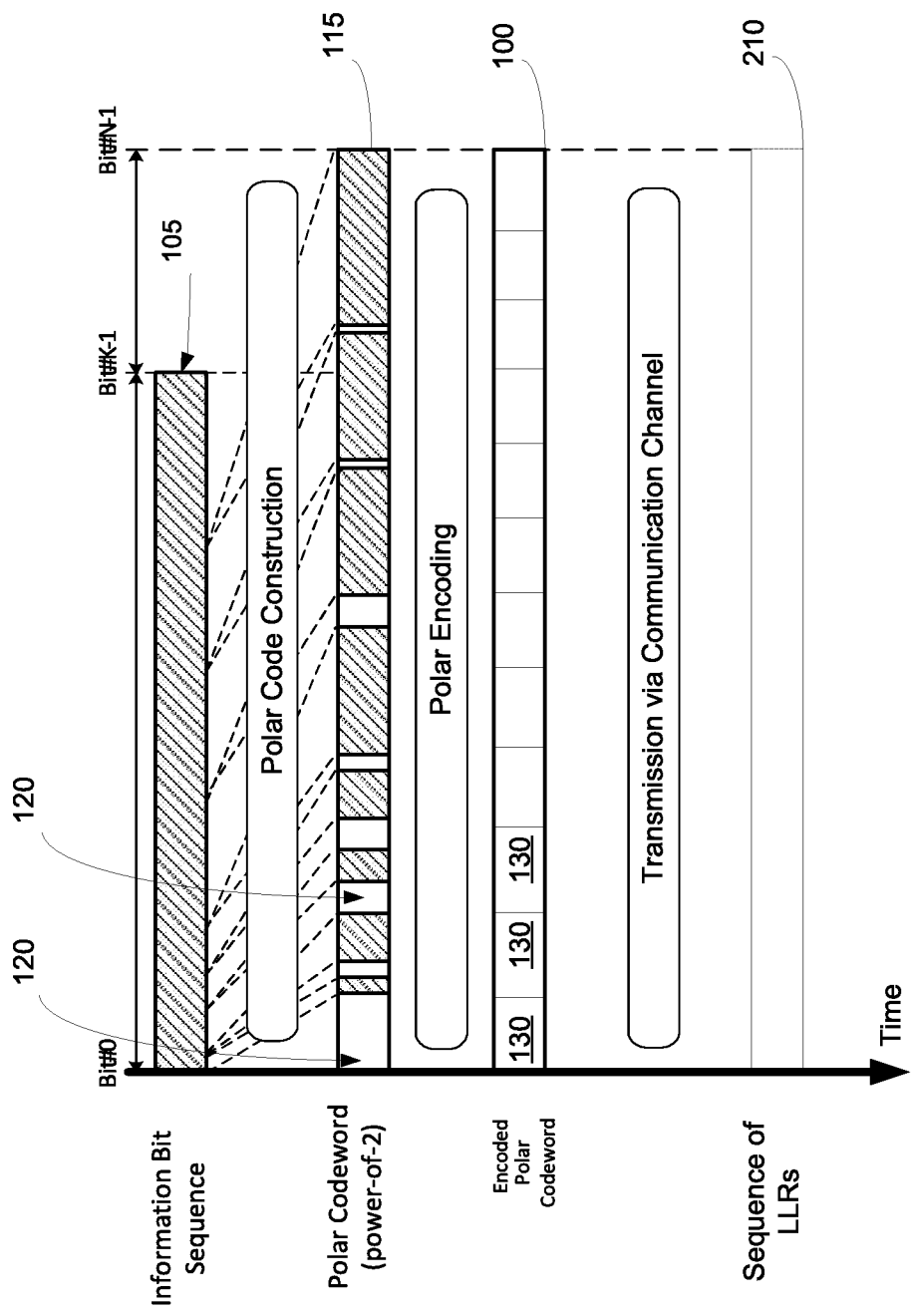
FIG. 1 (PRIOR ART) illustrates encoding of an encoded polar codeword.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current polar decoders. In particular, the instant disclosure describes a decoder, where a polar code decoder (also referred to herein as "polar decoder") is an example, and a method for code decoding (where polar code decoding is an example) that may decode codewords with various codeword rates and codeword lengths. Some embodiments of the decoder, e.g., polar code decoder and the method, as described herein, may be used in high-throughput per silicon area applications.

Throughout the present disclosure, the term "codeword node" refers to a portion of a codeword having several consecutive bits of the codeword. The number of the bits in the codeword node, referred to as "codeword node length", may vary. Various codeword node types may be defined depending on the number of frozen bits in the codeword node and their location with regards to information bits of the codeword node.

As used herein, the term "logarithmic likelihood ratio" or "LLR" refers to a multiple-bit number associated with each bit of the codeword. LLRs may also be referred to as "alpha value" for the polar decoder.

LLR represents a probability of a bit being either "0" or "1". A large absolute value of LLR means a strong probability that the transmitted bit is received as "1" or as "0". A sign of LLR indicates the bit polarity (decoded as a "1" or as a "0"). When the absolute value of LLR is "0", this signifies that the estimation of the corresponding bit is unreliable. When the absolute value of LLR is infinite, this signifies that the estimate of the corresponding bit is highly reliable.

As noted above, the term "codeword type" refers to a set of characteristics of a codeword. Such characteristics may include, for example, a codeword length defined by the number of bits N of the codeword, a number of information bits K in the codeword, and a polar code construction method that had been used to encode the codeword. The polar code construction method is determined by positions of K information bits within N code bits.

The polar code decoder as described herein may decode encoded codewords of various codeword types. That is, the polar decoder as described herein may decode the encoded codewords of various lengths, code rates, and polar code construction methods.

The polar code decoder as described herein may adapt to decoding of various encoded codewords due to an instruction sequence supplied to a codeword node decoding pipeline (also referred to herein as a "pipeline"). The pipeline has three hardware logic units which operate in a loop. The logic units of the pipeline may sequentially adapt to parameters of the encoded codeword nodes and the same logic units of the pipeline may sequentially decode all codeword nodes of one encoded codeword.

The instruction sequence supplied to the pipeline is based on parameters of a codeword node that is currently being decoded, such as, for example: a codeword node length and a codeword node type of the encoded codeword. Based on the received instruction sequence, the logic units of the pipeline may adapt to each codeword node that is being decoded. As the three logic units are arranged in a loop, the pipeline may decode any number of codeword nodes of an encoded codeword. Therefore, the pipeline may decode the encoded codewords of various lengths. In some embodiments, a scheduler controls the pipeline and sends commands, based on the instruction sequence, to the pipeline.

In addition to being flexible to process any codeword type, the polar decoder as described herein may be power-efficient. Several logic elements of the pipeline, which operate in a loop and are reused for decoding of different encoded codeword nodes, consume less energy per decoded bit when compared to the conventional unrolled polar decoders, such as UDPPD described above.

By cascading the polar decoders as described herein, the total combined decoding throughput may be as fast as 1 decoded codeword per clock cycle (CW/cc), if the number of polar decoders is equivalent to the codeword decoding latency. For example, if one codeword of one codeword type is decoded in 64 clock cycles (cc), then a combined system of 64 polar decoders may have a throughput equivalent to 1 CW/cc.

FIG. 1 illustrates encoding of an encoded polar codeword 100 (also referred to herein as "codeword 100"). The codeword 100 is generated by a polar encoder from information bits 105. A set of initial information bits 105 has K bits. The polar codeword 100 has N bits, from which there are (N−K) frozen bits 120.

It should be noted that N and K are integers. N may be a power of 2, or a power of any other integer. The other integer may be equivalent to a size of a polar kernel used to generate a polar matrix of a size of N×N. For example, $N=2^n$ when N is a power of 2, where n is an integer. For example, N may be 256, 512, 1024, etc.

Using different polar construction methods, the set of initial information bits 105 and the frozen bits 120 are aggregated into a polar codeword 115, as it is schematically illustrated in FIG. 1. The polar codeword 115 is then encoded using a polar code matrix to generate the encoded polar codeword 100.

Each bit of the codeword 100 may be represented with a codeword channel LLR. The codeword 100 may be represented with a sequence of codeword channel LLRs 210.

The encoded polar codeword 100 comprises codeword nodes 130. Each codeword node starts at a specific bit index.

Figure 2:
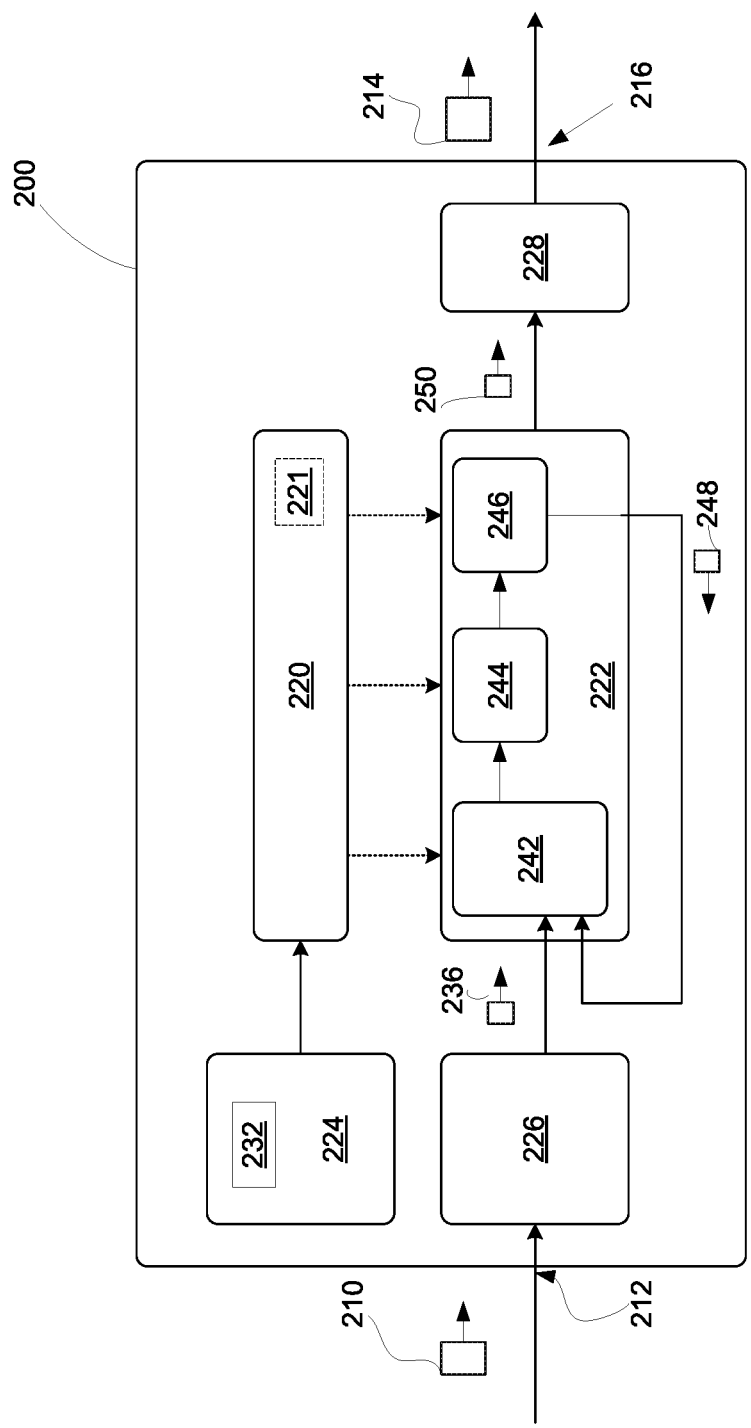
FIG. 2 depicts a block diagram of a circular pipelined polar code decoder (PCD), in accordance with various embodiments of the present disclosure.

FIG. 2 depicts a block diagram of a circular pipelined polar code decoder (PCD) 200, in accordance with various embodiments of the present disclosure.

The PCD 200 is configured to receive channel LLRs 210 of the encoded codeword 100 at a PCD input 212 and to generate decoded codeword bits 214 at a PCD output 216.

The PCD 200 depicted in FIG. 2 comprises a scheduler 220 and a codeword node decoding pipeline 222 (also referred to herein as a "pipeline 222"). The PCD 200 also comprises a program storage 224, an input storage 226 (also referred to herein as "input storage unit 226") and an output storage 228 (also referred to herein as "output storage unit 228"). Each of program storage 224, input storage 226 and output storage 228 are storage elements configured to store data. The input storage 226 and output storage 228 may be data buffers configured to store data temporarily.

The storage element may be, for example, a memory, a flip flop, a latch, etc. The program storage 224 may be configured to communicate with an external controller (not depicted) that may add, delete or replace a decoding program 232 in program storage 224.

The decoding program 232 is loaded into program storage 224 before the encoded codeword is processed. The decoding program 232 comprises one or more sequences of instructions (also referred to herein as an "instruction sequences"). Each instruction sequence is based on an encoded codeword node of the encoded codeword that is being decoded. In particular, the instruction sequence is based on the codeword node length and the codeword node type of the encoded codeword node.

In some embodiments, each instruction sequence corresponding to one codeword node may comprise the codeword node length and the codeword node type of the encoded codeword node. In some embodiments, the instruction sequence may comprise additional information such as, for example, a bit index of a first bit of the codeword node in the codeword. In other words, the instruction sequence is related to bit index of each encoded codeword node of the codeword. The program storage 224 is configured to store the instruction sequence(s).

Referring also to FIG. 1, each codeword node 130 may have any number of bits. For example, one codeword node may have 1 bit or hundreds of bits. When one codeword node has more than one bit, the bits of that codeword node are decoded simultaneously. A type of decoding to perform on the bits of one codeword node corresponds to the codeword node type and codeword node length.

The decoding program 232 may be adapted to any type of the codeword, as long as the codeword length N used in the decoding program 232 is equal to or less than a maximum codeword length supported by the hardware implementation of the PCD 200.

The PCD 200 may be configured to execute one decoding program 232 at a time. One decoding program 232 corresponds to a specific combination of codeword length N, code rate R and polar code construction method. There may be an infinite number of such combinations of codeword length, code rate and polar code construction method. A specific decoding program 232 may be provided for decoding a codeword of a first codeword type having length N1, a code rate R1, and a code construction method C1. In some embodiments, in order to decode a codeword of a second codeword type having second length N2 and a second code rate R2, the decoding program 232 may be replaced with a second decoding program (not depicted).

In some embodiments, an external memory (not depicted) may store various decoding programs 232. Such external memory may be, for example, a read-only memory (ROM). The external memory may be located in PCD 200. Alternatively, the external memory may be located separately from PCD 200 and may be operatively connected to PCD 200. The external memory may transfer one of decoding programs 232 to PCD 200. Before PCD 200 may start to decode a codeword, PCD 200 may receive access to decoding program 232 or to data on how to generate the decoding program 232.

In at least one embodiment, a new decoding program 232 for a codeword of the second codeword type may be generated while the PCD 200 decodes the codeword of the first codeword type. The decoding program 232 may be generated in software (for example, in C code) and transferred to an application-specific integrated circuit (ASIC) using an interface. The decoding program 232 may then be loaded to PCD 200. It should be understood that the new decoding program 232 may be loaded while the previous decoding program 232 is still being executed at PCD 200. The new decoding program 232 may then replace the previous decoding program 232.

In some embodiments, decoding program 232 may be generated in hardware by a dedicated hardware logic located outside of PCD 200. In such implementation, the memory occupied by decoding program 232 in program storage 224 and the number of instructions provided by decoding program 232 may be limited by hardware parameters of program storage 224.

In some embodiments, PCD 200 may operate without program storage 224 and individual instructions of the decoding program 232 may be loaded directly from an external storage (not depicted). In such embodiment, the length of the decoding program 232 may be unlimited.

Referring again to FIG. 2, PCD 200 receives channel LLRs 210 of the encoded codeword at PCD input 212. In a wireless system, LLRs 210 may be received from a demodulator module (not depicted). In at least one embodiment, an input storage 226 is configured to receive and store channel LLRs 210.

The input storage 226 comprises storage element(s) which store(s) channel LLRs 210 of the encoded codewords before decoding. The input storage 226 may comprise, for example, register elements. When current LLRs are not required anymore for processing by PCD 200 and new LLRs may be accepted, input storage 226 may send an indication of a "decoder ready" status to an upstream module. Such upstream module may be, for example, a demodulator module. The input storage 226 may thus request a new channel LLRs sequence 210 corresponding to a new encoded codeword 100. The input storage 226 then stores new channel LLRs 210 of the encoded codeword.

LLRs 210 may also be stored in an external memory and dispatched to PCD 200 when PCD 200 becomes available to receive another codeword. It should be understood that data flow before and after the PCD 200 may be determined by application(s) and system specifications.

After decoding of a current encoded codeword 100 is completed, the decoded codeword bits 214 are generated by and transmitted out of PCD 200. In some embodiments, a status of input storage 226 may be set back to "decoder ready" and LLRs 210 of another codeword may be loaded to input storage 226 after decoding of the current encoded codeword has been completed.

In other embodiments, input storage 226 may receive LLRs of a new encoded codeword and replace LLRs of the current codeword before the end of decoding of the current encoded codeword 100. The PCD 200 may request LLRs of the new encoded codeword while the current encoded codeword is still being decoded. Based on the bit index and the codeword length, PCD determines that the current channel LLRs stored in input storage 226 may safely be replaced with LLRs of another codeword.

The pipeline 222 decodes codewords' codeword nodes 130. The pipeline 222 comprises three hardware logic units 242, 244, 246 which are: an F-G processing unit 242, a specialized decoding unit 244, and a partial sum (PSUM) unit 246. Each one of hardware logic units 242, 244, 246 executes one phase of a decoding process of the pipeline 222. The three-phase pipeline 222 may be controlled by scheduler 220.

The scheduler 220 is a processor which is configured to read the instruction sequence of decoding program 232 and control the decoding pipeline 222 based on the instruction sequence. The scheduler 220 may have a counter 221. The counter 221 may help to determine a bit index of a codeword node of the encoded codeword that is about to be processed in the currently processed codeword 100.

The counter 221 may also help to determine when a last bit of the current codeword has been decoded, and when it is time to decode the next codeword. For example, the counter 221 may receive an indication when the LLRs 210 corresponding to one codeword 100 have been received by PCD 200, or any other indication. The counter 221 may help to synchronize decoding of LLRs by pipeline 222 with transmission of instruction sequences to pipeline 222.

Based on the bit index of the codeword node of the codeword, scheduler 220 reads the instructions and may determine how to control the logic units 242, 244, 246 of the pipeline 222. For example, scheduler 220 may identify the F or G operation for each stage of the F-G processing unit 242. Scheduler 220 may also activate specialized decoding unit 244 and select one of decoding methods or specify codeword node type in described below. Scheduler may also control PSUM unit by instructing to compute and store a specific set of PSUM values.

The instruction sequence may comprise the codeword node length and the codeword node type of each codeword node. Thus, by using the bit index of the codeword node, scheduler 220 may control adjustment of logic units 242, 244, 246 of pipeline 222 to each encoded codeword node by sending commands to logic units 242, 244, 246.

In some embodiments, bit index of the codeword node may be determined by counter(s) and/or units (not depicted) located in pipeline 222. As discussed above, PCD 200 may operate without scheduler 220 by using the instruction sequence received from program storage 224 or elsewhere. In yet another alternative embodiment, commands, when delivered to pipeline 222, may include the bit index.

In some embodiments, a codeword node type identifier may be received by pipeline 222 along with LLRs. The codeword node type identifier may then be transmitted to scheduler 220 in order to instruct scheduler 220 to fetch corresponding instructions in program storage 224.

In some embodiments, PCD 200 may operate without program storage 224, and scheduler 220 may generate commands "on-the-fly" to decode the codeword node based on the codeword type and length. Such implementation may require additional logic elements to identify the codeword node type, and may use more power.

The pipeline 222 is flexible and may be controlled dynamically by the instruction sequence during decoding of each codeword node. For each codeword node, pipeline 222 receives commands that are based on the codeword node length and the codeword node type of the codeword node. The commands received for each codeword node are based on an instruction sequence for a whole codeword.

Based on the commands received for the codeword node and a bit index of the codeword node, pipeline 222 adapts to decoding of that codeword node. The decoding performed by logic units 242, 244, 246 of pipeline 222 is based on the codeword node type, the codeword node length, and the bit index of the codeword node of the current codeword.

Each one of logic units 242, 244, 246 of pipeline 222 may be configured to process data during one clock cycle. Each logic unit 242, 244, 246 of pipeline 222 may have a maximum latency of one clock cycle. For higher-throughput applications, logic units 242, 244, 246 may operate during the same clock cycle. This may be possible when decoding of some codeword nodes may be quick. For example, a codeword node that has a sequence of frozen bits may be decoded to generate an all-zero output, such that only one clock cycle may be required to traverse the three logic units 242, 244, 246 of the pipeline 222.

The F-G processing unit 242 comprises a plurality of F-G processing elements (also referred to as "F-G processing elements"). The F-G processing unit 242 operates an F-G computation tree.

The F-G computation tree has several F-G tree stages (also referred to herein as "F-G processing stages"). The number of F-G tree stages that are used, when decoding an encoded codeword, depends on the number of bits in the encoded codeword. For example, a codeword having 16 bits may correspond to 16 channel LLRs that are received by PCD 200. For example, in order to decode 16 channel LLRs, four F-G tree stages may be used: F-G tree stage #3, F-G tree stage #2, F-G tree stage #1 and F-G tree stage #0. In another example, in order to decode a codeword with 1024 bits, and therefore, when 1024 channel LLRs are received, there may be 10 F-G tree stages. An F-G tree stage that receives LLRs from input storage 226 are referred to herein as the "upmost F-G tree stage", and an F-G tree stage that generates intermediate LLR results is referred to herein as the "lowest F-G tree stage".

Each F-G tree stage has F-G processing elements. The number of F-G processing elements used at each F-G tree stage depends on the F-G tree stage index. For example, a full F-G tree for a codeword of length of N=1024 requires 1023 F-G processing elements, with 512 F-G processing elements on the upmost F-G tree stage (STAGE #9) and 1 codeword processing element in the lowest F-G tree stage (STAGE #0). At each F-G tree stage, F or G operations as described below are performed by F-G processing elements. Each F-G processing element performs one F or G operation based on two LLRs (or intermediate LLRs), a partial sum value (for G operation only) and generates one result.

Based on the instructions received, F-G processing unit 242 performs either F or G operations. In other words, F-G processing unit 242 executes selectively, based on instructions received, F arithmetic operation or G arithmetic operation as described below.

In operation, the upmost F-G tree stage of F-G processing unit 242 receives simultaneously two channel LLRs 236 from input storage 226. The other F-G tree stages receive intermediate LLR values. For example, one F-G tree codeword node of F-G processing unit 242 may receive LLR #1 and LLR #2.

When performing F operation at the F-G tree codeword node, F-G processing unit 242 combines two input LLRs, such as LLR #1 and LLR #2. F-G processing unit 242 generate a LLR result of F operation as follows:

$$\text{Sign}(LLR\ \#1)*\text{Sign}(LLR\ \#2)*\text{Min}(|LLR\ \#1|,|LLR\ \#2|). \quad (1)$$

The F-G processing unit 242 also receives a partial sum (PSUM) value 248 from output storage 228 described below. PSUM value 248, schematically illustrated in FIG. 2, may be used when F-G processing unit 242 executes G operation. The PSUM value 248 may have 1 bit of data. When decoding the first codeword node (i.e. the codeword node having bit index i=0) of a new codeword, the PSUM value 248 is set to "0". The first codeword node may be determined based on F operations. PSUM value 248 is then updated after decoding of the first codeword node.

When performing G operation at the F-G processing element, F-G processing unit 242 combines two input LLRs, such as LLR #1 and LLR #2, based on PSUM value 248, received from output storage 228. The LLR result of G operation is:

$$LLR\ \#2+LLR\ \#1,\ \text{if}\ PSUM\ \text{bit value}=1'b0; \quad (2)$$

$$LLR\ \#2-LLR\ \#1,\ \text{if}\ PSUM\ \text{bit value}=1'b1. \quad (3)$$

In at least one embodiment, PCD 200 further comprises an intermediate LLR storage (not depicted) that is configured to receive and store intermediate LLR results from one or more F-G tree stages. The intermediate LLR storage may temporarily store the results of one or more F-G tree stages. Such intermediate LLR storage for one or more F-G tree stages may need additional hardware and may increase a decoding latency. The intermediate LLR storage may comprise, for example, flip flops.

The specialized decoding unit 244 is configured to execute a decoding logic based on the codeword node type. The specialized decoding unit 244 executes a second phase of the 3-phase pipeline 222: so-called "decoding phase".

The decoding logic executed by specialized decoding unit 244 comprises combinatorial logic and uses the intermediate LLR result from a stage #X of the F-G tree, where X is: X=$\log_2$ (codeword node length). In other words, the specialized decoding unit 244 applies combinatorial logic to the intermediate LLR results received from F-G processing unit 242.

The specialized decoding unit 244 may be configured to decode using a simplified successive cancellation (so-called Fast-SSC) method known in the art. Fast-SSC decoding codeword nodes may be, for example: Rate-0 (R0), Rate-1 (R1), Repetition (REP), Bi-repetition (B-REP), and single-bit parity check (SPC) decoding codeword nodes.

In some embodiments, codeword node types, corresponding to Fast-SSC decoding codeword nodes, are as follows. Rate-0 (R0) corresponds to a sequence of frozen bits. Rate-1 (R1) corresponds to a sequence of information bits. Repetition (REP) corresponds to a sequence of frozen bit followed by one information bit. Bi-repetition (B-REP) corresponds to a sequence of frozen bit followed by two information bits. Single-bit Parity Check (SPC) corresponds to a sequence of one frozen bit followed by information bits.

To further reduce the decoding latency, PCD 200 may also implement custom decoding codeword node logic.

The instructions received by pipeline 222 for the specialized decoding unit 244 indicate which one of the Fast-SSC decoding codeword nodes need to be used for decoding the current encoded codeword node. The specialized decoding unit 244 generates decoded bits and transmits them to PSUM unit 246.

At the third phase of pipeline 222, PSUM unit 246 applies N×N polar code matrix to the decoded bits (in other terms, "decoded bit estimates") received from specialized decoding unit 244. PSUM unit 246 combines previously decoded bits with modulo-2 sum and generates PSUM value 248. PSUM unit 246 also stores locally the accumulated PSUM results. As noted above, PSUM values 248 may then be used by F-G processing unit 242 when G operation is executed.

The output storage 228 receives from pipeline 222 and stores decoded bits 250 of codeword's codeword nodes. The decoded bits 250 are accumulated in output storage 228.

For a codeword of codeword length of N bits, there may be N−1 distinct PSUM values. Out of these N−1 distinct PSUM values, N/2 PSUM values may be used in the upmost stage of the F-G tree, N/4 PSUM values may be used for the next stage, and so on. The lowest stage of the F-G tree may be executed using 1 PSUM value.

In some embodiments, decoded bits 250 may be generated from PSUM values 248 after all codeword nodes of the codeword have been decoded. Alternatively, both PSUM values 248 and decoded bits 250 may be stored at output storage 228. The output storage 228 may have registers which store PSUM values 248 for each one of G arithmetic units of the F-G processing unit 242.

In some embodiments, output storage 228 may store PSUM values 248 for a set of bits of the codeword. The decoded bits 250 may be generated for such set of bits and then also stored in output storage 228.

In conventional polar decoders such as UDPPDs, each phase of a UDPPD pipeline has a dedicated decoding logic that processes a particular codeword node. Once the pipeline of the UDPPD is fully loaded, UDPPD can receive, decode and transmit one codeword per clock cycle. The data associated with the codeword is forwarded inside the UDPPD pipeline at each clock cycle.

The data that is forwarded in the UDPPD pipeline includes LLRs, intermediate results, PSUM and previously decoded bits. Moving of the data in the UDPPD pipeline may require many thousands of storage elements. Moreover, moving of the data in the UDPPD pipeline generates wire toggling in the hardware logic and increases power consumption by the UDPPDs.

In PCD 200 disclosed herein, LLRs and PSUM do not need to move through numerous logic hardware elements. The allocated input storage 226 and output storage 228 store LLRs, PSUM, and intermediate results. This reduces power consumption by PCD 200. Compared to the conventional polar decoders, PCD 200 efficiently uses and reuses the same three logic units of pipeline 222: F-G processing unit 242, specialized decoding unit 244, and PSUM unit 246.

In PCD 200, decoding logic units 242, 244, 246 of pipeline 222 are reused in a loop over and over again for decoding of different codeword nodes of one codeword. The sequence of instructions provided to the pipeline 222 permit the pipeline 222 and its three logic units 242, 244, 246 to adjust to any type of codeword node. In some embodiments, the scheduler 220 may control each one of logic units of pipeline 222 based on the length and type of each codeword node of the encoded codeword by providing the commands to the decoding logic units 242, 244, 246.

The codeword nodes that correspond to the sets of LLRs processed by the pipeline 222 may have different codeword node lengths and codeword node types. The F-G processing unit 242, specialized decoding unit 244 and PSUM unit 246 as described herein adapt to the codeword node type and codeword node length of each codeword node. That is, PCD 200 may use one F-G processing unit 242, one specialized decoding unit 244 and one PSUM unit 246 to process all various codeword nodes of the codeword. The pipeline 222 may adapt to any length N of the codeword and to any codeword rate R based on the instruction sequence for the codeword received by PCD 200. The pipeline 222 then adapts to each codeword node based on the commands that the pipeline 222 receives for each codeword node.

Figure 3:
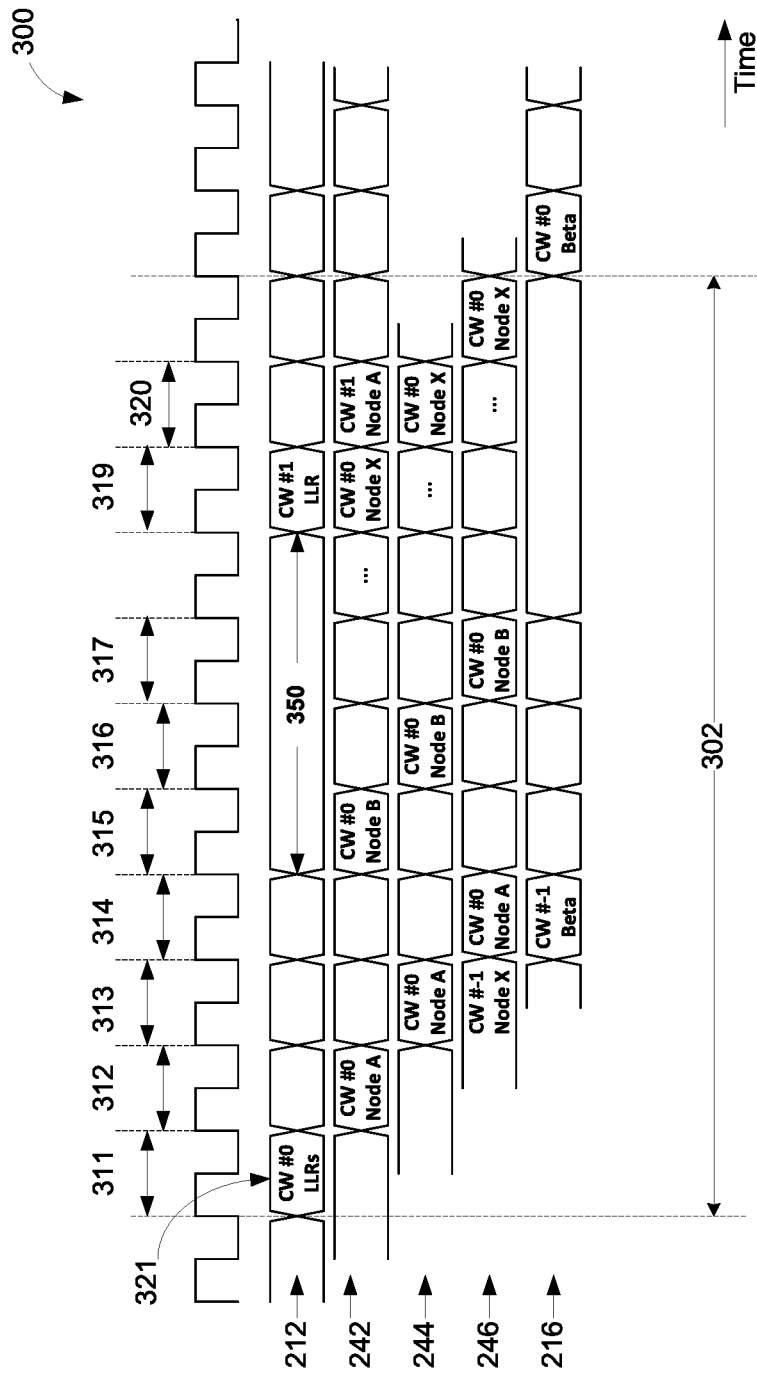
FIG. 3 a timing diagram illustrating processing of channel logarithmic likelihood ratios (LLR) of one codeword by PCD of FIG. 2.

FIG. 3 depicts a timing diagram 300 illustrating processing of channel LLRs of a first codeword by PCD 200, in accordance with at least one non-limiting embodiment of the present disclosure. The LLRs of the first codeword "CW #0" is decoded during a decoding latency 302. When describing FIG. 3, reference is also made to FIG. 2.

During a first clock cycle 311, PCD 200 receives at its input 212 a first set of LLRs 321 of a first codeword, depicted as "CW #0 LLRs" in FIG. 3. As described above, scheduler 220 may receive the instructions that may specify the number of codeword nodes in the first encoded codeword and the corresponding codeword node types. For example, the instructions may indicate that the first encoded codeword has X codeword nodes: Codeword Node A, Codeword Node B, . . . Codeword Node X.

Using the counter 221, scheduler 220 may determine bit index of currently processed bit and determines which codeword node is being currently processed. Based on the codeword node type and codeword node length of the currently processed codeword node, scheduler 220 may transmit the instructions to decoding pipeline 222.

During a second clock cycle 312, F-G processing unit 242 executes F or G operation on LLRs corresponding to Codeword Node A of first codeword CW #0. The F-G processing unit 242 then transmits the intermediate LLR results of the encoded Codeword Node A to specialized decoding unit 244.

During a third clock cycle 313, the specialized decoding unit 244 executes decoding codeword node logic based on the type of Codeword Node A of the first codeword CW #0. The specialized decoding unit 244 then transmits the decoded bits of Codeword Node A to PSUM unit 246.

During the fourth clock cycle 314, PSUM unit 246 generates PSUM value 248 for Codeword Node A. The PSUM value 248 and decoded bits 250 of Codeword Node A are then transmitted to output storage 228. The output storage 228 receives and stores PSUM values 248 and decoded bits 250 of Codeword Node A. The output storage 228 also sends the PSUM value 248 back to F-G processing unit 242 as described above.

During the fifth clock cycle 315, F-G processing unit 242 executes F operation or G operation on a second set of LLRs corresponding to Codeword Node B of the first codeword. During the sixth clock cycle 316, specialized decoding unit 244 process intermediate LLR results of Codeword Node B. During the seventh clock cycle 317, PSUM unit 246 determines PSUM values 248 of Codeword Node B.

The processing of all codeword nodes of the first codeword CW #0 continues sequentially in a loop formed by F-G processing unit 224, specialized decoding unit 244 and PSUM unit 246. The PSUM values for each codeword node may be stored in output storage 228. After processing of each codeword node, PSUM unit 246 transmits PSUM values 248 determined for the previously processed codeword node to F-G processing unit 224.

Codeword Node X of CW #0 is the last codeword node of the first codeword. During a clock cycle 319, when F-G processing unit 242 is processing Codeword Node X of CW #0, other sets of LLRs, corresponding to the second codeword CW #1, may be loaded to PCD 200 at PCD input 212. It should be understood that the codewords may have any number of codeword nodes.

In some embodiments, a new set of LLRs corresponding to a second codeword CW #1 may be loaded once the last bit of a first encoded codeword CW #0 is decoded. Decoding of the second encoded codeword CW #1 may start while the LLRs corresponding to the last codeword node (Codeword Node X) of first encoded codeword's CW #0 are being processed by specialized decoding unit 244. Therefore, during a clock cycle 320 and several subsequent clock cycles, two codewords CW #0 and CW #1 may be processed simultaneously by PCD 200.

In some embodiments, before accepting LLRs of the second codeword CW #1, PCD 200 may need to wait during waiting time 350 while all codeword nodes except for the last Codeword Node X of the encoded codeword CW #0 have been processed.

Referring again to FIG. 2, as discussed above, F-G processing unit 242 executes the logic of the F-G computational tree in PCD 200 and therefore comprises several F-G tree stages. When PCD 200 processes one codeword in segments of 128 bits, the upper F-G tree stages (such as, for example, F-G tree stage #9, F-G tree stage #8, and F-G tree stage #7, not depicted in FIG. 2) are applied to each codeword every 128 bits. However, F-G processing unit 242 has many F-G processing elements that implement the F or G operations at the upper F-G tree stages. For example, F-G tree stage #9, F-G tree stage #8, and F-G tree stage #7 have 512, 256, and 128 processing elements, respectively.

Sharing resources of the upper F-G tree stages may be useful for processing of more than one codeword using one polar decoder, as discussed herein below.

Figure 4:
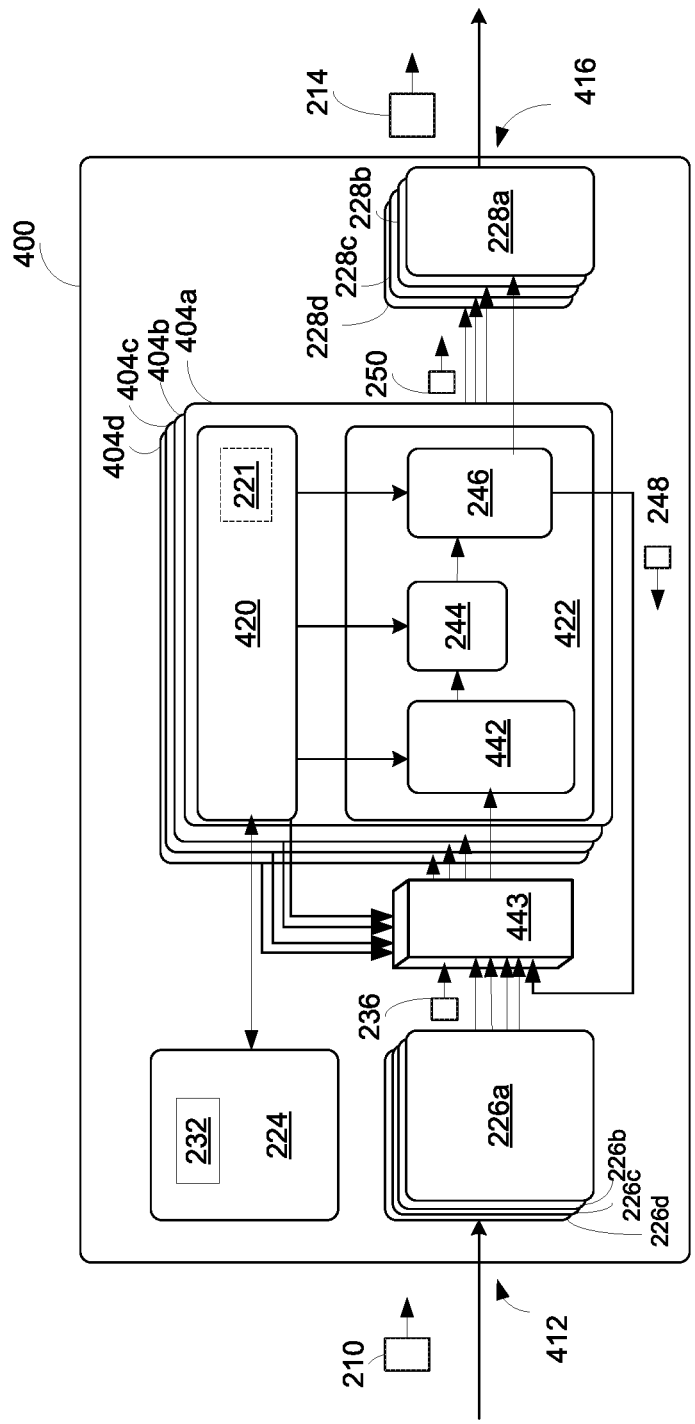
FIG. 4 depicts a resource sharing decoder (RSD), in accordance with various embodiments of the present disclosure.

FIG. 4 depicts a resource sharing decoder (RSD) 400, in accordance with at least one non-limiting embodiment of the present disclosure. The RSD 400 has program storage 224 which has been discussed above.

The RSD 400 also has RSD modules 404a, 404b, 404c, 404d. Each RSD module 404a, 404b, 404c, 404d has a resource sharing scheduler 420 and a resource sharing pipeline 422. The RSD 400 also has a set of input storage units 226a, 226b, 226c, 226d and a set of output storage units 228a, 228b, 228c, 228d. In some embodiments, each RSD module 404a, 404b, 404c, 404d may comprise one input storage unit 226a, 226b, 226c, 226d and one output storage unit 228a, 228b, 228c, 228d, respectively.

Each resource sharing pipeline 422 comprises three hardware logic units: a lower-stage F-G processing unit 442, specialized decoding unit 244, and PSUM unit 246. The specialized decoding unit 244, and PSUM unit 246 have been described above. The RSD 400 also has an upper-stage F-G processing unit 443.

The upper-stage F-G processing unit 443 and lower-stage F-G processing unit 442 are similar to the F-G processing unit 242 described above for PCD 200. The upper-stage F-G processing unit 443 and lower-stage F-G processing unit 442 have processing elements configured to execute several F-G tree stages. Processing elements of each F-G tree stage are configured to execute F or G operation on incoming LLRs. In the upper-stage F-G processing unit 443, the upper F-G tree stages may be shared among RSD modules 404a, 404b, 404c, 404d for execution of F or G operations.

The lower-stage F-G processing unit 442 is located in each RSD module 404a, 404b, 404c, 404d. The upper-stage F-G processing unit 443 is configured to execute upper-stage F-G tree operations. The lower-stage F-G processing unit 442 is configured to execute lower-stage F-G tree operations.

The upper-stage F-G processing unit 443 is configured to receive channel LLRs from input storage units 226a, 226b, 226c, 226d. The intermediate LLR results generated by the upper-stage F-G processing unit 443 are transmitted to one of lower-stage F-G processing units 442 located in one of RSD module 404a, 404b, 404c, 404d.

It should be understood that the number of F-G tree stages, that are included in upper-stage F-G processing unit 443 and are shared, may vary. In some embodiments, the upper-stage F-G processing unit 443 may include F-G tree stage #9, F-G tree stage #8, and F-G tree stage #7. In other embodiments, upper-stage F-G processing unit 443 may also include F-G tree stage #6. In yet other embodiments, the upper F-G tree stages, that are shared between the RSD modules 404a, 404b, 404c, 404d, may include only F-G tree stage #9 and F-G tree stage #8. The number of F-G tree stages that needs to be used in decoding also may depend on the codeword node length. For example, upper-stage F-G processing unit 443 may include F-G tree stage #7 and F-G tree stage #6.

PSUM unit 246 receives and stores PSUM values from resource sharing pipeline 422 in each RSD module 404a, 404b, 404c, 404d. Decoded bits 250 are received by and stored in output storage units 228a, 228b, 228c, 228d.

The number of codewords that may be processed in parallel by RSD 400 is defined by the number of RSD modules 404a, 404b, 404c, 404d. For example, due to shared upper-stage F-G processing unit 443 between four RSD modules 404a, 404b, 404c, 404d, resource sharing decoder 400 may decode simultaneously four codewords without increasing decoding latency.

For example, an assembly of 16 RSDs 400 may receive and transmit one codeword per clock cycle, if each RSDs 400 decodes 4 codewords in parallel with the other RSDs 400 of the assembly, and if decoding of one codeword of codeword length of N=1K takes 64 clock cycles.

Figure 5:
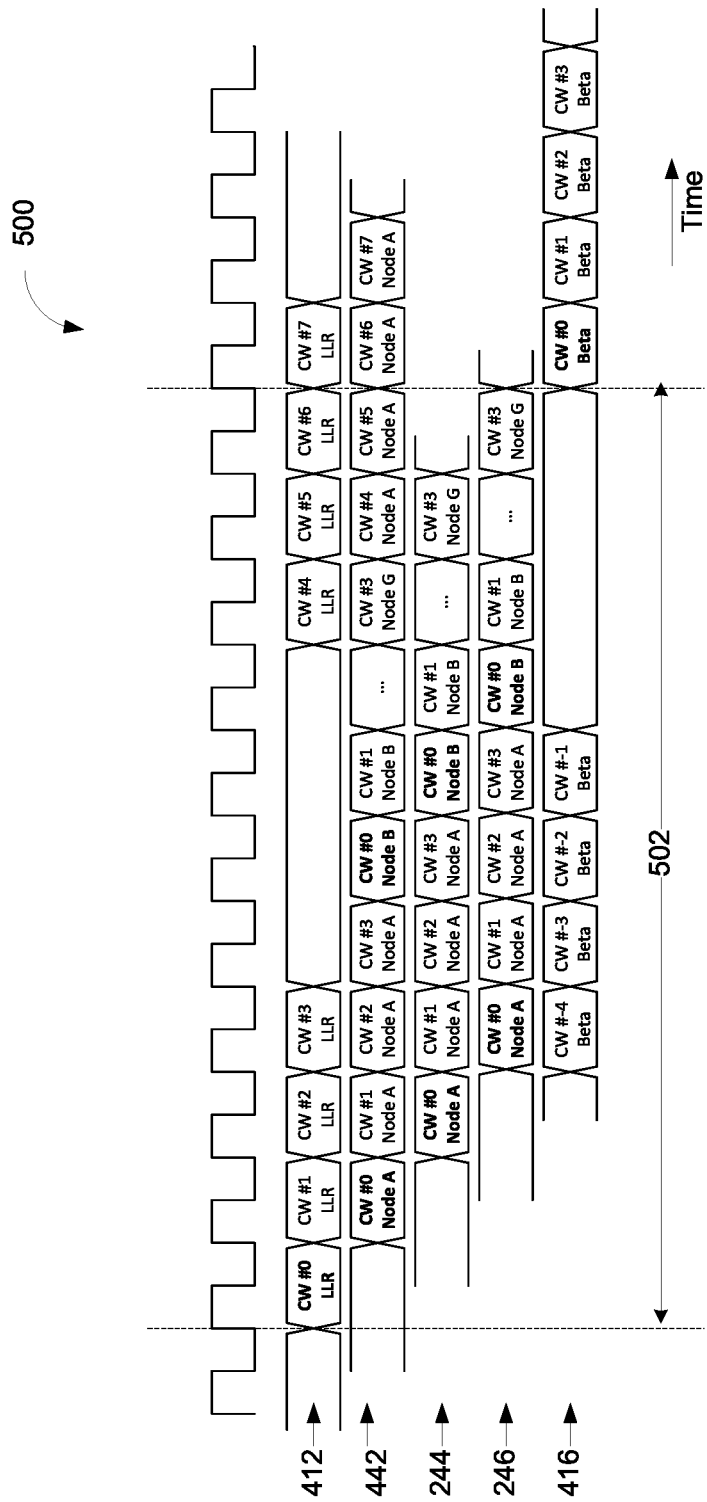
FIG. 5 depicts a timing diagram illustrating decoding of several codewords by the RSD of FIG. 4.

FIG. 5 depicts a timing diagram illustrating how four codewords are decoded in parallel by RSD 400, in accordance with at least one non-limiting embodiment of the present disclosure.

Four pluralities of LLRs corresponding to four codewords, depicted as "CW #0 LLR", "CW #1 LLR", "CW #2 LLR", "CW #3 LLR" in FIG. 5, are loaded in the RSD 400. The codewords are processed in parallel by resource sharing pipeline 422. During each clock cycle, lower-stage F-G processing unit 442 processes one Codeword node A of each codeword. The codeword's decoded bits are transmitted out once the last bit of that codeword is decoded.

It should be understood that there may be any number of RSD modules 404a, 404b, 404c, 404d in RSD 400. In some embodiments, four may be an optimal number of RSD modules 404a, 404b, 404c, 404d in RSD 400 for sharing of the upper stages of the F-G computation tree.

Figure 6:
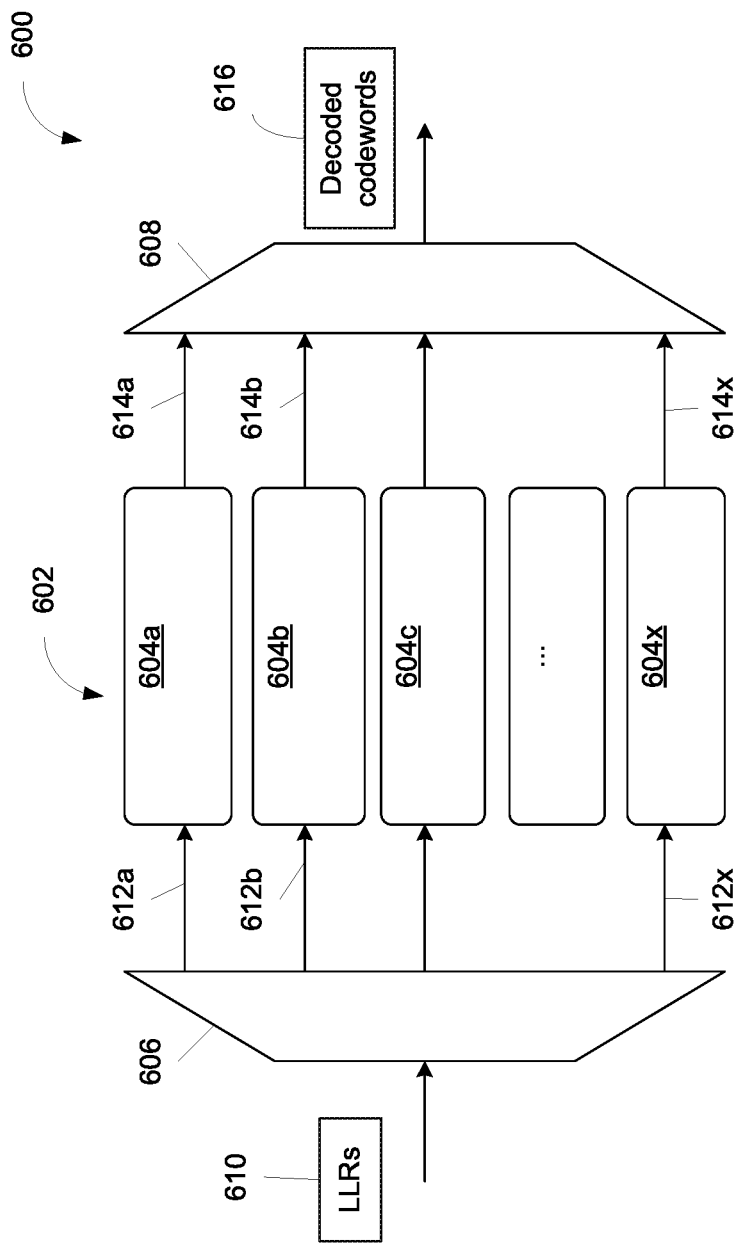
FIG. 6 depicts a vertical array decoder (VAD), in accordance with various embodiments of the present disclosure.

FIG. 6 depicts a vertical array decoder (VAD) 600, in accordance with at least one non-limiting embodiment of the present disclosure.

The VAD 600 comprises a decoder set 602 of X decoders 604a, 604b . . . 604x. X is the number of decoders in set 602. Each one of decoders 604a, 604b . . . 604x is connected to a demultiplexer 606 and to a multiplexer 608. In other words, decoders 604a, 604b . . . 604x are connected in parallel. The decoders 604a, 604b . . . 604x may have the same hardware elements as PCD 200 in FIG. 2. In other words, two or more PCDs 200 may form a polar decoder array. Alternatively, decoders 604a, 604b . . . 604x may have the same hardware elements as RSD 400. In other words, two or more RSDs 400 may form the polar decoder array.

The demultiplexer 606 receives channel LLRs 610 that correspond to one or more codewords. The demultiplexer 606 then dispatches the LLRs corresponding to one encoded codeword to one of the decoder modules 604a, 604b . . . 604x. Decoder module 604a thus receives and processes the sets of LLRs 612a corresponding to one encoded codeword. Decoder module 604b receives and processes the sets of LLRs 612b corresponding to another encoded codeword, etc.

In other terms, demultiplexer 606 is configured to receive groups (or pluralities) of sets of LLRs corresponding to more than one codewords, and transmit one group (or plurality) of sets of LLRs to each PCD 200 or RSD 400 of VAD 600.

The corresponding decoded codewords 614a, 614b . . . 614x are then transmitted to multiplexer 608. Having received decoded codewords 614a, 614b . . . 614x, multiplexer 608 then generates sequentially the decoded codewords 616.

In other terms, multiplexer 608 is configured to receive one decoded codeword from each PCD 200 or RSD 400 of VAD 600, and to generate sequentially the decoded codewords.

The VAD 600 may be composed of many decoders modules 604a, 604b . . . 604x. The throughput of VAD 600 is defined by the number of codewords that VAD 600 can process per second. By changing the number X of decoder modules 604a, 604b . . . 604x in decoder set 602, the throughput of VAD 600 may be changed to adapt to specific applications. Throughput per decoder module 604a, 604b . . . 604x may remain the same. Adding additional decoder modules may increase the overall throughput linearly.

The codewords are separated in time by a constant time interval when they are received by VAD 600. Many codewords may be processed in parallel by VAD 600. If two sequential codewords of the same type arrive with a delay of one clock cycle, and two decoder modules are ready to start decoding, their decoded bit estimates may be generated with a mutual delay of one clock cycle. If the system's throughput is less than input codeword throughput, the input of codewords may be stopped.

Figure 7:
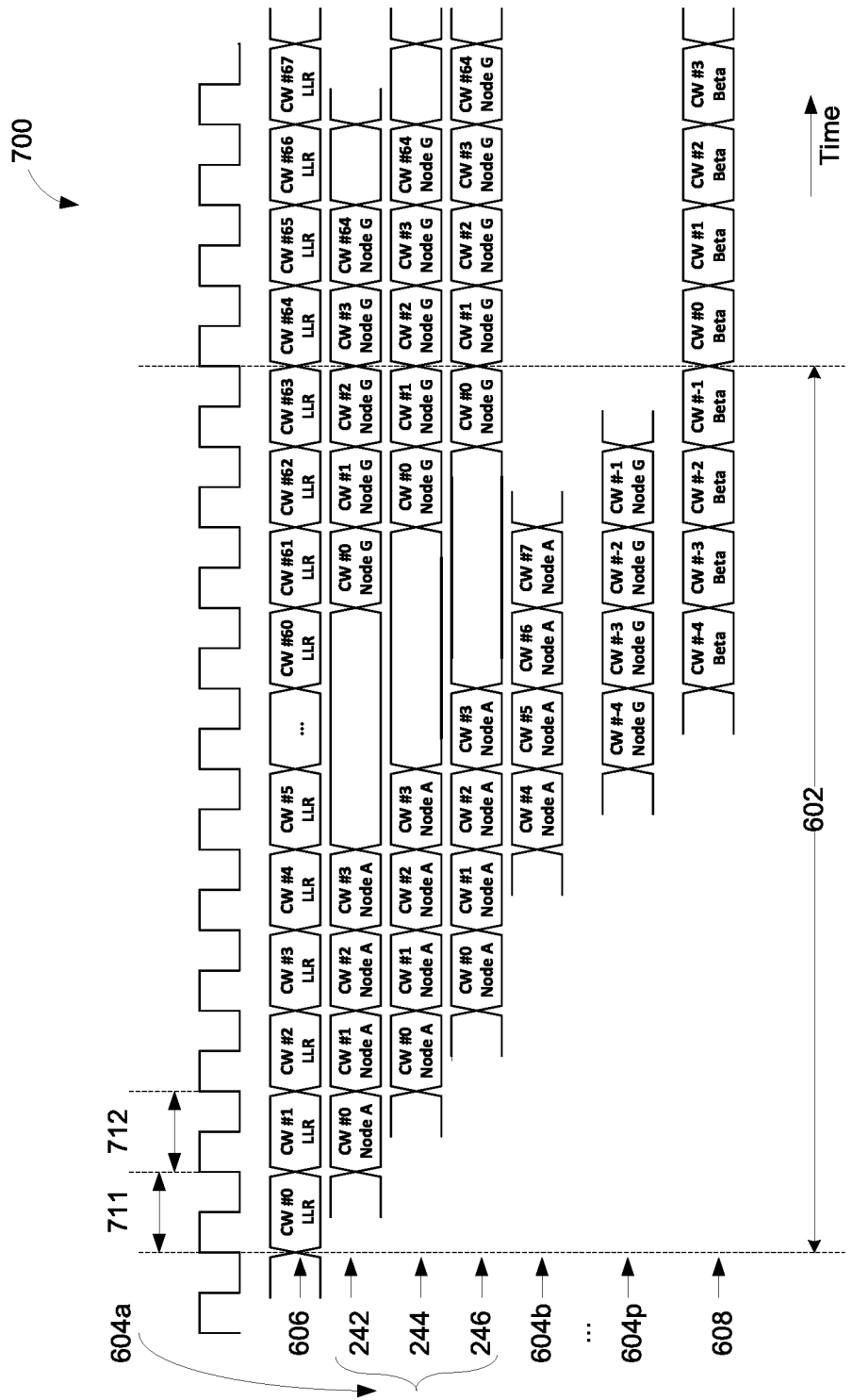
FIG. 7 depicts a timing diagram illustrating operation of VAD of FIG. 6.

FIG. 7 depicts a timing diagram 700 illustrating operation of VAD 600 having 16 decoder modules, in accordance with at least one non-limiting embodiment of the present disclosure. In this non-limiting embodiment, decoder modules 604a, 604b . . . 604p are implemented as resource sharing decoders 400. When describing FIG. 6, reference will be made to FIG. 4 and FIG. 6.

Assuming that the decoding latency 602 for a codeword type is 64 clock cycles, VAD 600 receives 64 subsets of LLRs corresponding to 64 encoded codewords during these 64 clock cycles. VAD 600 receives one subset of LLRs corresponding to one encoded codeword at the input of demultiplexer 606 at each clock cycle 611, 612, etc.

The first decoder module 604a processes a first subset of LLRs of the first four codewords CW #0, CW #1, CW #2, CW #3. The second decoder module 604b processes LLRs of next four codewords CW #4, CW #5, CW #6, CW #7. Finally, the sixteenth decoder module 604p processes LLRs corresponding to the last four codewords CW #60, CW #61, CW #62, CW #63.

Figure 8:
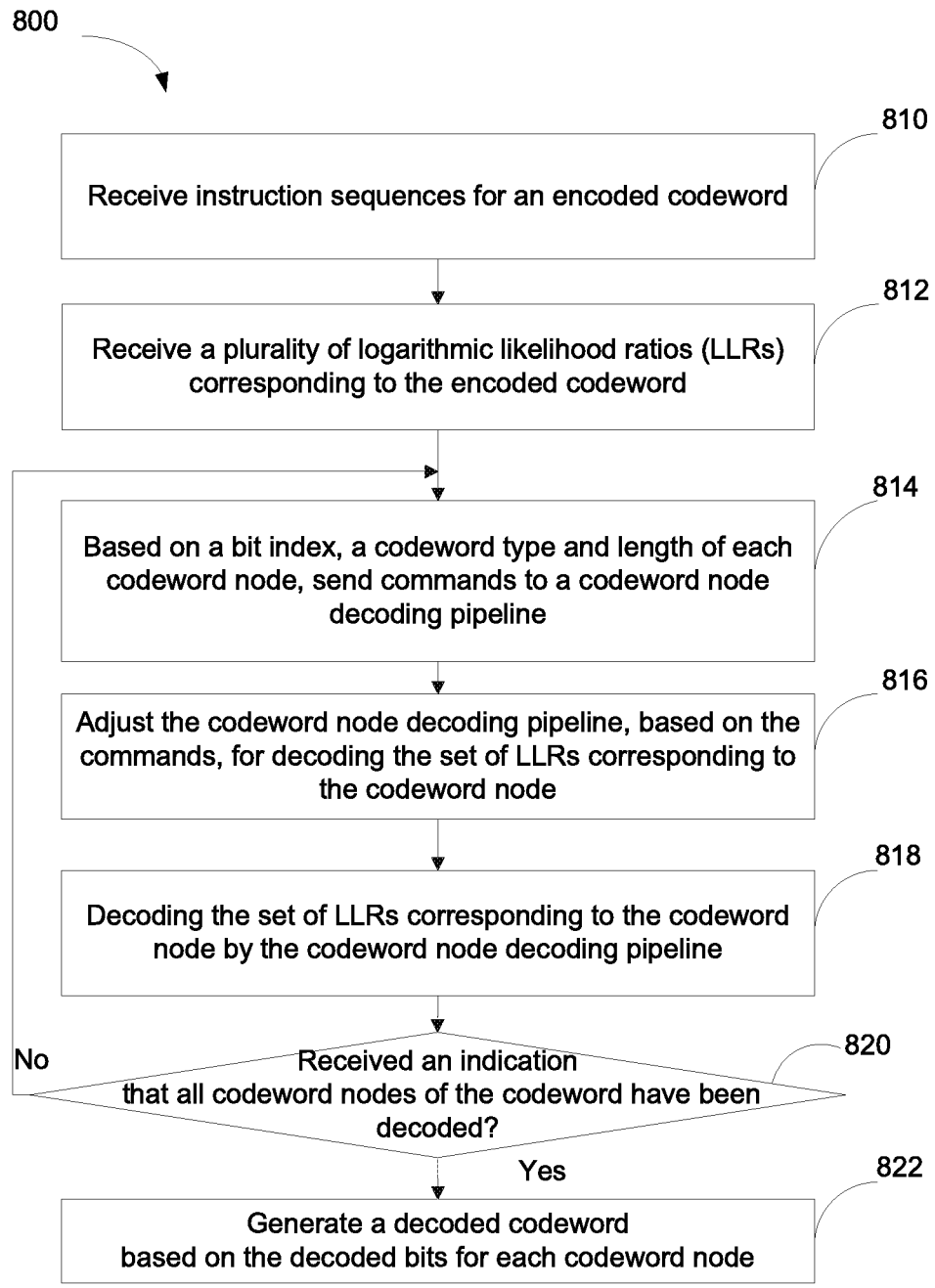
FIG. 8 depicts a flow chart illustrating a method for decoding polar codes, in accordance with various embodiments of the present disclosure.

FIG. 8 depicts a flow chart illustrating a method 800 for decoding a codeword that was encoded using polar codes, in accordance with at least one non-limiting embodiment of the present disclosure. When describing FIG. 8, reference will be also made to FIGS. 1-7.

At step 810, PCD 200 receives instruction sequences for an encoded codeword.

At step 812, a plurality of LLRs corresponding to the encoded codeword is received by PCD 200.

A codeword node decoding pipeline 222 then receives a set of intermediate LLR results corresponding to the current encoded codeword node. At the same time, a current bit index of the currently processed encoded codeword is determined for example, by a counter 221.

At step 814, the scheduler 220 may read the instruction sequence and transmit commands to the codeword node decoding pipeline 222 in order to adjust for decoding of a set of LLRs corresponding to the codeword node. The commands provided to codeword node decoding pipeline 222 are based on the values of the codeword node length and the codeword node type of the encoded codeword node.

In some embodiments, the commands corresponding to one codeword node may comprise the codeword node length and the codeword node type of the encoded codeword node that needs to be decoded. In some embodiments, the commands may comprise additional information such as, for example, a bit index of a first bit of the codeword node that needs to be decoded.

The codeword node decoding pipeline 222 receives the specific commands based on the instruction sequence. The commands depend on the values of the codeword node length, the codeword node type, and bit index of the current encoded codeword node. The instruction sequence received by PCD 200 is based on codeword node lengths and the codeword node types of all codeword nodes of the codeword.

The F-G processing unit 242 may receive a command that specifies a number of F-G processing elements and F-G processing stages to be used in F-G processing unit when executing F or G operation to the set of LLRs.

Specialized decoding unit 244 may receive a command specifying which decoding logic needs to be executed in order to generate decoded bits from intermediate LLR results.

PSUM unit 246 may receive a command requesting to compute a specific set of partial sum values and store the set of partial sum values.

The logic units 242, 244, 246 of codeword node decoding pipeline 222 adjust to the codeword in accordance with the commands received at step 816. In other words, the three logic units adjust for decoding of the encoded codeword node based on the instruction sequence received earlier by PCD 200.

The pipeline 222 decodes the encoded codeword node at step 818 of method 800. Decoded bits are generated by the codeword node decoding pipeline 222 and stored. PSUM value is generated and is transmitted to F-G processing unit of the codeword node decoding pipeline 222.

At step 820, method 800 determines whether all encoded codeword nodes of the encoded codeword have been decoded. For example, an indication may be received if all codeword nodes of the codeword have been decoded.

If the encoded codeword has not been fully decoded, scheduler 220 reads new instruction sequence for the next codeword node. Scheduler 220 then transmits new commands to the codeword node decoding pipeline 222 in order to adjust pipeline 222 to the next codeword node. Simultaneously, new set of LLRs corresponding to the next codeword node is transmitted to codeword node decoding pipeline 222.

At step 822, after receiving decoded bits corresponding to each encoded codeword node of the encoded codeword, PCD 200 generates a decoded codeword.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A decoder comprising:
   an input configured to receive a set of logarithmic likelihood ratios (LLRs) corresponding to an encoded codeword node;
   a program storage configured to store a plurality instruction sequences;
   a scheduler configured to:
      read values of a codeword node length and a codeword node type of the encoded codeword node,
      select one of the instruction sequences based on the value of the codeword node length and on the value of the codeword node type, and
      generate commands based on the selected instruction sequence;
   a codeword node decoding pipeline configured to:
      receive the commands,
      based on the commands, make a selection of one or more processing methods implemented in one or more logic units of the codeword node decoding pipeline, and decode the encoded codeword node by applying the one or more selected processing methods to the set of LLRs to generate decoded bits corresponding to the encoded codeword node;
   an output storage configured to store the decoded bits corresponding to each encoded codeword node; and
   a decoder output operatively connected to the output storage and configured to output a decoded codeword generated based on the decoded bits.

2. The decoder of claim 1, wherein the one or more logic units of the codeword node decoding pipeline comprise:
   a hardware-based F-G processing unit configured to apply selectively one of F and G arithmetic operations to the set of LLRs to generate intermediate LLR results, the F-G processing unit being configured to apply the F arithmetic operation by:
      fetching a first LLR and a second LLR from the set of LLRs, the first and second LLRs having a first value LLR1 and a second value LLR2 respectively; and
      determining a first intermediate LLR having a third value LLR3 from the first and second LLRs, the third value LL3 being defined as:

$$LLR3 = Sign(LLR1) * Sign(LLR2) * Min(|LLR1|, |LLR2|);$$

the F-G processing unit being configured to apply the G arithmetic operation by:
      fetching a third LLR and a fourth LLR from the set of LLRs, the third and fourth LLRs having a fourth value LLR4 and a fifth value LLR5 respectively;
      fetching a partial sum value PSUM from the output storage, the partial sum value PSUM being based on the decoded bits of a respective encoded codeword node; and
      determining a second intermediate LLR having a sixth value LLR6 from the third and fourth LLRs, and the partial sum value PSUM, the sixth value LL6 being defined as:

$$LLR6 = LLR5 + LLR4, \text{ if } PSUM = 0, \text{ and}$$

$$LLR6 = LLR5 - LLR4, \text{ if } PSUM = 1;$$

the selection of the F and G arithmetic operations being based on a bit index of the encoded codeword node;
   a hardware-based specialized decoding unit connected to the F-G processing unit and configured to:
      receive the intermediate LLR results from the F-G processing unit, and
      execute a decoding logic on the intermediate LLR results based on the codeword node type, and to generate the decoded bits of the encoded codeword node; and
   a hardware-based partial sum (PSUM) unit connected to the specialized decoding unit and configured to:
      receive, from the specialized decoding unit, the decoded bits of the encoded codeword node, and generate a PSUM value.

3. The decoder of claim 2, wherein the PSUM unit is further configured to transmit the PSUM value of the decoded codeword node to the F-G processing unit.

4. The decoder of claim 2, wherein:
   the codeword node decoding pipeline is one of a set of codeword node decoding pipelines having other codeword node decoding pipelines, and the decoder further comprises an upper-stage F-G processing unit configured to:
      receive other sets of LLRs;
      receive, from the PSUM unit, a set of PSUM values for performing the G arithmetic operations;
      perform F-G arithmetic operations on the other sets of LLRs;
      generate intermediate LLR results; and
      transmit the intermediate LLR results to the other codeword node decoding pipelines.

5. The decoder of claim 1, wherein the commands generated by the scheduler are further based on a bit index of each encoded codeword node.

6. The decoder of claim 1, wherein the scheduler is further configured to control the adjustment of the codeword node decoding pipeline based on a bit index of the codeword node.

7. The decoder of claim 6, wherein the scheduler further comprises a counter configured to determine the bit index of a currently processed encoded codeword node of the encoded codeword.

8. The decoder of claim 1, wherein the input storage is configured to transmit the set of LLRs corresponding to each encoded codeword node at each clock cycle.

9. The decoder of claim 1, wherein the decoder is one of a plurality of decoders forming a polar decoder array of a vertical array decoder, the set of LLRs being one of a plurality of sets of LLRs, the plurality of sets of LLRs corresponding to one codeword of a plurality of codewords, and the a vertical array decoder further comprises:
 a demultiplexer configured to:
  receive pluralities of sets of LLRs corresponding to the plurality of codewords, and
  transmit one plurality of sets of LLRs of the pluralities of sets of LLRs to each decoder of the plurality of decoders; and
 a multiplexer configured to receive one decoded codeword from each decoder of the plurality of decoders and to generate sequentially a plurality of decoded codewords.

10. A decoding method, the method comprising:
receiving a plurality of sets of logarithmic likelihood ratios (LLRs) corresponding to an encoded codeword, the encoded codeword having at least one encoded codeword node;
for each encoded codeword node of the encoded codeword:
 receiving a set of LLRs corresponding to the encoded codeword node;
 selecting one or more processing methods implemented in one or more logic units of a codeword node decoding pipeline based on commands, the commands being based on values of a codeword node length and a codeword node type of the encoded codeword node; and
 applying, by the codeword node decoding pipeline, the one or more processing methods to decode the set of LLRs, corresponding to the encoded codeword node; and
generating a decoded codeword based on the decoded bits received from the codeword node decoding pipeline for each encoded codeword node of the encoded codeword.

11. The method of claim 10, wherein:
applying, by the codeword node decoding pipeline, the one or more processing methods to decode the set of LLRs corresponding to the encoded codeword node comprises selectively applying, by a F-G processing unit, one of F and G arithmetic operations to the set of LLRs, application of a F arithmetic operation by the F-G processing unit comprising the steps of:
 fetching a first LLR and a second LLR from the set of LLRs, the first and second LLRs having a first value LLR1 and a second value LLR2 respectively; and
 determining a first intermediate LLR having a third value LLR3 from the first and second LLRs, the third value LL3 being defined as:

LLR3=Sign(LLR1)*Sign(LLR2)*Min(|LLR1|, |LLR2|);

application of a G arithmetic operation by the F-G processing unit comprising the steps of:
 fetching a third LLR and a fourth LLR from the set of LLRs, the third and fourth LLRs having a fourth value LLR4 and a fifth value LLR5 respectively;
 fetching a partial sum value PSUM from the output storage, the partial sum value PSUM being based on the decoded bits of a respective encoded codeword node; and
 determining a second intermediate LLR having a sixth value LLR6 from the third and fourth LLRs, and the partial sum value PSUM, the sixth value LL6 being defined as:

LLR6=LLR5+LLR4, if PSUM=0, and

LLR6=LLR5−LLR4, if PSUM=1; and adjusting the codeword node decoding pipeline to the encoded codeword node further comprises:
 setting a number of F-G processing stages to be used when applying the one of F and G operation to the set of LLRs, each F-G processing stage using a number of F-G processing elements of the F-G processing unit.

12. The method of claim 10, wherein adjusting the codeword node decoding pipeline to the encoded codeword node further comprises:
setting a decoding logic to be executed at a specialized decoding unit of the codeword node decoding pipeline by identifying a set of intermediate LLRs and selecting a combinatorial logic decoding routine to be executed thereon.

13. The method of claim 10, wherein applying, by the codeword node decoding pipeline, the one or more processing methods comprises:
determining intermediate LLR results at an F-G processing unit of the codeword node decoding pipeline by applying selectively one of F and G arithmetic operations to the set of LLRs.

14. The method of claim 13, wherein applying, by the codeword node decoding pipeline, the one or more processing methods further comprises:
determining decoded bits of the encoded codeword node by applying combinatorial logic to the intermediate LLR results.

15. The method of claim 13, wherein applying, by the codeword node decoding pipeline, the one or more processing methods further comprises:
determining partial sum (PSUM) values of the decoded bits and transmitting the PSUM values to the F-G processing unit.

16. The method of claim 15, further comprising storing the PSUM values and the decoded bits for each encoded codeword node prior to generating the decoded codeword.

17. The method of claim 10, wherein commands are related to bit index of each encoded codeword node.

* * * * *